(12) United States Patent
Cheng et al.

(10) Patent No.: US 9,589,833 B1
(45) Date of Patent: Mar. 7, 2017

(54) PREVENTING LEAKAGE INSIDE AIR-GAP SPACER DURING CONTACT FORMATION

(71) Applicants: International Business Machines Corporation, Armonk, NY (US); GLOBALFOUNDRIES Inc., Grand Kayman (KY)

(72) Inventors: Kangguo Cheng, Schenectady, NY (US); Ruilong Xie, Niskayuna, NY (US); Tenko Yamashita, Schenectady, NY (US)

(73) Assignees: International Business Machines Corporation, Armonk, NY (US); Global Foundries Inc., Grand Kayman (*) Notice: Subject to any disclaimer, the term of this patent is extended or adjusted under 35 U.S.C. 154(b) by 0 days.

(21) Appl. No.: 14/850,093

(22) Filed: Sep. 10, 2015

(51) Int. Cl.
| | | |
|---|---|---|
| *H01L 29/423* | (2006.01) | |
| *H01L 21/768* | (2006.01) | |
| *H01L 29/06* | (2006.01) | |
| *H01L 23/535* | (2006.01) | |
| *H01L 29/78* | (2006.01) | |
| *H01L 29/66* | (2006.01) | |

(52) U.S. Cl.
CPC .... *H01L 21/76831* (2013.01); *H01L 21/7682* (2013.01); *H01L 21/76805* (2013.01); *H01L 21/76895* (2013.01); *H01L 23/535* (2013.01); *H01L 29/0649* (2013.01); *H01L 29/66477* (2013.01); *H01L 29/78* (2013.01)

(58) Field of Classification Search
CPC ......... H01L 21/76816; H01L 21/76877; H01L 29/42336; H01L 29/4236
See application file for complete search history.

(56) References Cited

U.S. PATENT DOCUMENTS

| | | |
|---|---|---|
| 6,180,988 B1 | 1/2001 | Wu |
| 6,468,877 B1 | 10/2002 | Pradeep et al. |
| 6,548,362 B1 | 4/2003 | Wu |
| 7,132,342 B1 | 11/2006 | Sadovnikov et al. |
| 7,514,752 B2 | 4/2009 | Kohyama |
| 7,691,712 B2 | 4/2010 | Chidambarrao et al. |
| 7,741,663 B2 | 6/2010 | Hause et al. |
| 7,838,373 B2 | 11/2010 | Giles et al. |
| 8,390,079 B2 | 3/2013 | Horak et al. |
| 8,502,287 B2 | 8/2013 | Radic et al. |
| 2011/0309416 A1 | 12/2011 | Yamashita et al. |
| 2011/0309430 A1* | 12/2011 | Purayath ........... H01L 21/28273 257/321 |

OTHER PUBLICATIONS

J. Park et al., "Air Spacer MOSFET Technology for 20nm Node and Beyond," 9th International Conference on Solid-State and Integrated-Circuit Technology (ICSICT), Oct. 2008, pp. 53-56, Beijing, China.

* cited by examiner

*Primary Examiner* — Jae Lee
(74) *Attorney, Agent, or Firm* — Vazken Alexanian; Ryan, Mason & Lewis, LLP (57) ABSTRACT

Techniques for preventing leakage of contact material into air-gap spacers during contact formation. For example, a method comprises forming a contact trench on a semiconductor structure over an air-gap spacer and depositing a liner in the contact trench. The liner deposition material fills a portion of the air-gap spacer pinching off the contact trench to the air-gap spacer.

15 Claims, 7 Drawing Sheets

PREVENTING LEAKAGE INSIDE AIR-GAP SPACER DURING CONTACT FORMATION

BACKGROUND

Transistor speed and power are significant parameters in the developing nanometer technologies. In attempts to reduce the size of the transistors, source/drain contacts are placed close to gate sidewalls effectively increasing the parasitic capacitance between the gate and source/drain contacts. This increase in parasitic capacitance results in reduced speed and increase in power. Parasitic capacitance between the gate and source/drain contacts is effected by the spacer material used to isolate the gate from the source/drain contacts. To reduce the parasitic capacitance and thereby improve performance, typical spacers such as nitride spacers and oxide spacers have been replaced with air-gap spacers. However, the use of air-gap spacers can easily lead to leakage of gate contact material inside the air-gap spacer during gate contact formation. Leakage of the gate contact material into the air-gap spacer can cause gate to source/drain contact shorts or reliability issues such as gate to source/drain contact breakdown.

SUMMARY

Embodiments provide techniques for preventing leakage of contact material into air-gap spacers during contact formation. For example, in one embodiment, a method comprises forming a contact trench on a semiconductor structure over an air-gap spacer and depositing a liner in the contact trench. The liner deposition material fills a portion of the air-gap spacer pinching off the contact trench to the air-gap spacer.

DETAILED DESCRIPTION

Embodiments will now be described in further detail with regard to techniques for preventing contact material leakage during contact formation in metal-oxide-semiconductor field-effect transistor (MOSFET) devices having air-gap spacers. It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual devices.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices, such as, for example, but not limited to, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example, 1% or less than the stated amount. Also, in the figures, the illustrated scale of one layer, structure, and/or region relative to another layer, structure, and/or region is not necessarily intended to represent actual scale.

Figure 1:
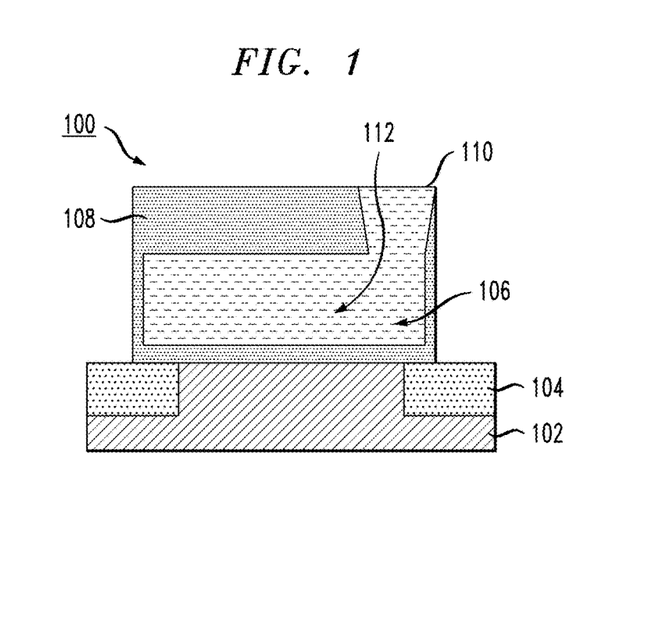
FIG. 1 is a cross-sectional side view of a metal-oxide-semiconductor field-effect transistor (MOSFET) in which the gate contact trench has etched through the inter layer dielectric and into the air-gap spacer.

An illustrative embodiment for preventing contact material leakage in MOSFET devices having air-gap spacers will be described below with reference to FIGS. 1 through 8C. For example, gate contact material can easily leak into an air-gap spacer during gate contact metallization (referred to herein as a subway condition). Reactive ion etching (RIE) of a gate contact trench can break through an inter layer dielectric exposing the air-gap spacer. FIG. 1 illustrates a MOSFET device 100 in which a leakage has occurred between an etched gate contact trench 110 and an air-gap spacer 106. FIG. 1 is a cross-sectional side view of the MOSFET device 100 through the air-gap spacer 106 in which gate contact metallization 112 has entered into the air-gap spacer 106. The MOSFET device 100 further comprises silicon substrate 102, shallow trench isolation 104, and inter layer dielectric 108. FIG. 1 also shows the path of the gate contact metallization 112 entering the gate contact trench 110 and passing into the air-gap spacer 106 (i.e., subway condition).

Figure 2:
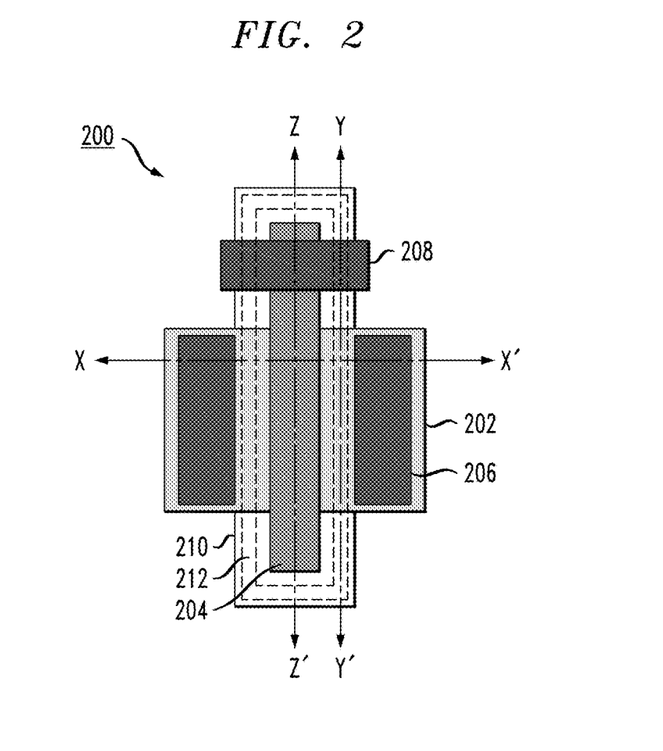
FIG. 2 is a top view of a MOSFET showing source/drain, gate, source/drain contacts, gate contact, and inter layer dielectric comprising an air-gap spacer, according to an embodiment of the invention.

In accordance with a first embodiment, FIG. 2 illustrates a top view of a MOSFET device 200 showing source/drain 202, gate 204, source/drain contacts 206, gate contact 208, inter layer dielectric 210, and air-gap spacer 212. In addition, the XX', YY' and ZZ' axes indicate respective planes for cross-sectional side views of the MOSFET device 200 which are used in FIGS. 3A through 8C to demonstrate the process for preventing contact material from leaking into air-gap spacers during contact formation (i.e., preventing subway condition or also referred to as providing air-gap spacer subway protection).

FIGS. 3A through 8C illustrate an embodiment of the invention showing the process flow used to prevent contact material leakage. More specifically, FIGS. 3A through 8C demonstrate steps to prevent gate contact material from leaking into air-gap spacers during gate contact formation but they are not intended to limit the scope of the invention to preventing gate contact material leakage into air-gap spacers. It will be apparent to those skilled in the art that techniques disclosed in FIGS. 3A through 8C apply to any contact formation.

Figure 3A:
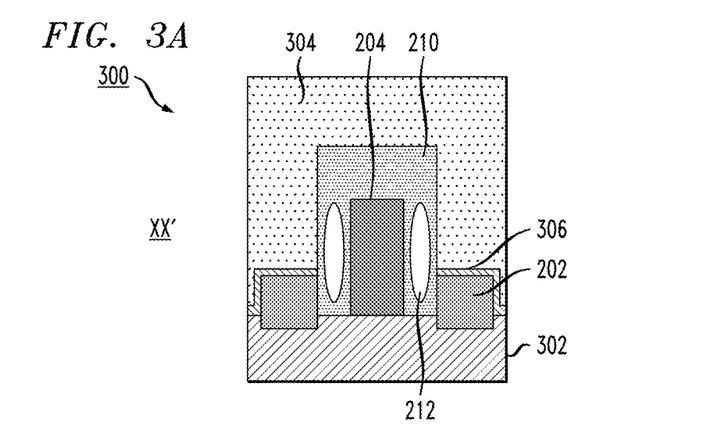
FIG. 3A illustrates a cross-sectional side view of the MOSFET of FIG. 2 along the XX' axis, according to an embodiment of the invention.
Figure 3B:
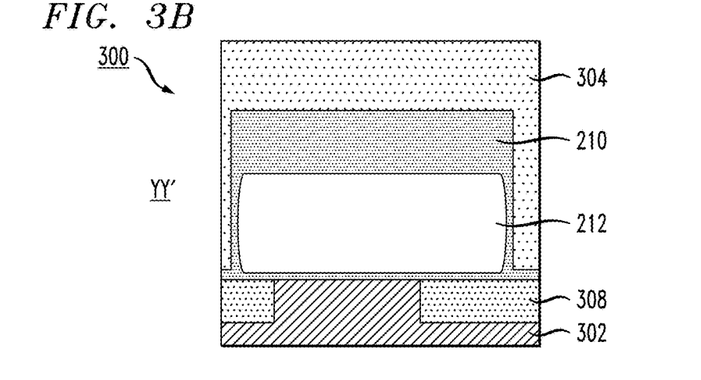
FIG. 3B illustrates a cross-sectional side view of the MOSFET of FIG. 2 along the YY' axis, according to an embodiment of the invention.
Figure 3C:
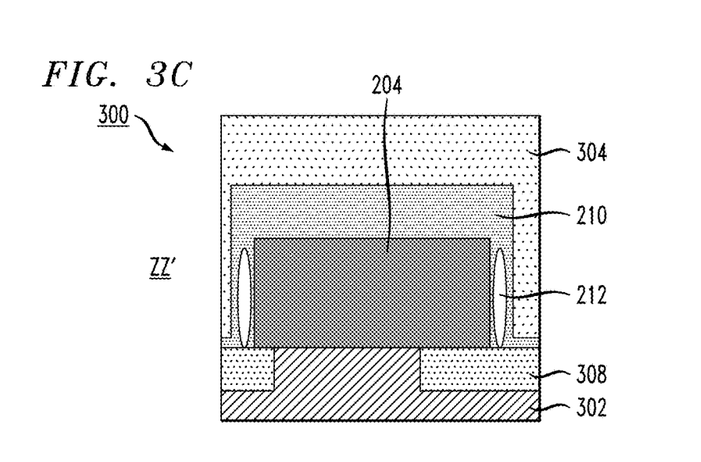
FIG. 3C illustrates a cross-sectional side view of the MOSFET of FIG. 2 along the ZZ' axis, according to an embodiment of the invention.

The first step in the process is to deposit an additional oxide layer after self-aligned contact (SAC) cap chemical mechanical polishing (CMP). FIGS. 3A through 3C illustrate cross-sectional side views of the MOSFET device 200 along the XX', YY' and ZZ' axes, respectively. FIG. 3A shows a cross-sectional side view along the XX' axis and comprises a silicon substrate 302, source/drain 202, a gate 204, an inter layer dielectric 210, an air-gap spacer 212 and an oxide layer 304. Additionally, a silicon nitride (SiN) poly-silicon open CMP (POC) layer 306 is deposited on the source/drain 202, isolating the source/drain 202 from oxide layer 304. The SiN POC layer 306 provides an etch stop during the source/drain contact trench etching process. FIG. 3B is a cross-sectional side view along the YY' axis and additionally illustrates shallow trench isolation 308. FIG. 3C is a cross-sectional side view along the ZZ' axis illustrating portions of the air-gap spacer 212 which is shown above and below gate 204 in FIG. 2.

Figure 4A:
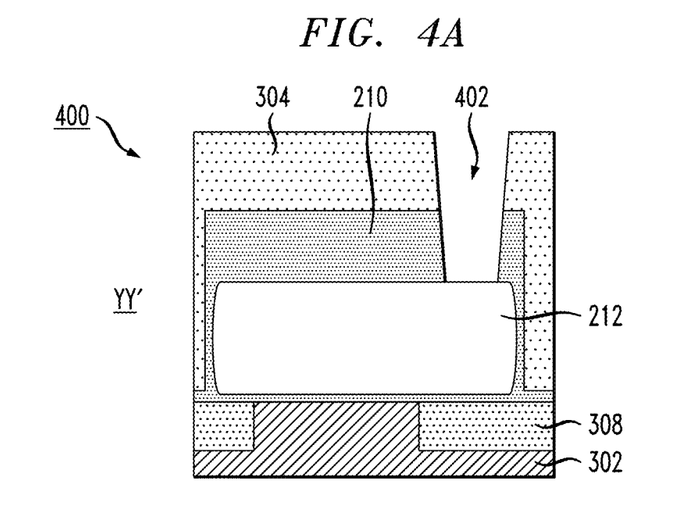
FIG. 4A illustrates a cross-sectional side view of the MOSFET of FIG. 2 along the YY' axis after gate contact reactive ion etching (RIE), according to an embodiment of the invention.
Figure 4B:
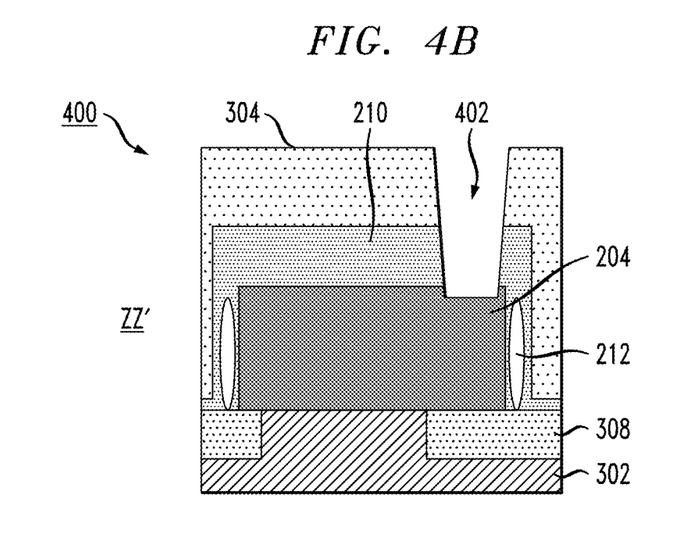
FIG. 4B illustrates a cross-sectional side view of the MOSFET of FIG. 2 along the ZZ' axis after gate contact RIE, according to an embodiment of the invention.

In the next step of the process, a first RIE of the oxide layer 304 and inter layer dielectric 210 is performed in order to form a gate contact trench. FIG. 4A shows a cross-sectional side view of the MOSFET device 200 along the YY' axis but after the gate contact RIE. FIG. 4A illustrates the portion of the gate contact trench 402 over the air-gap spacer 212. Similarly, FIG. 4B illustrates a cross-sectional side view of the MOSFET device 200 along the ZZ' axis and the portion of the gate contact trench 402 over the gate 204.

Figure 5A:
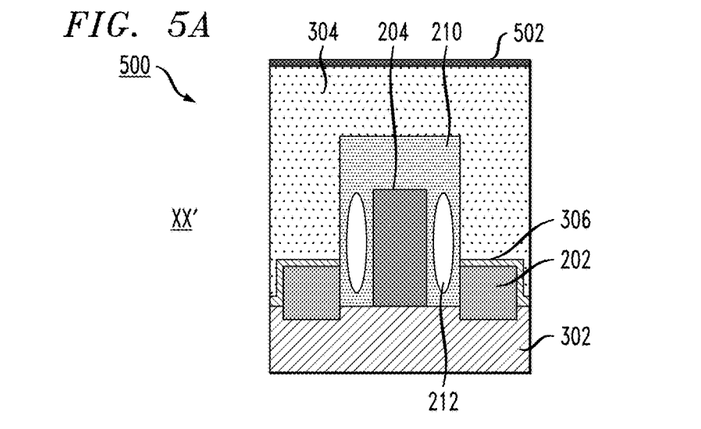
FIG. 5A illustrates a cross-sectional side view of the MOSFET of FIG. 2 along the XX' axis after SiN deposition, according to an embodiment of the invention.
Figure 5B:
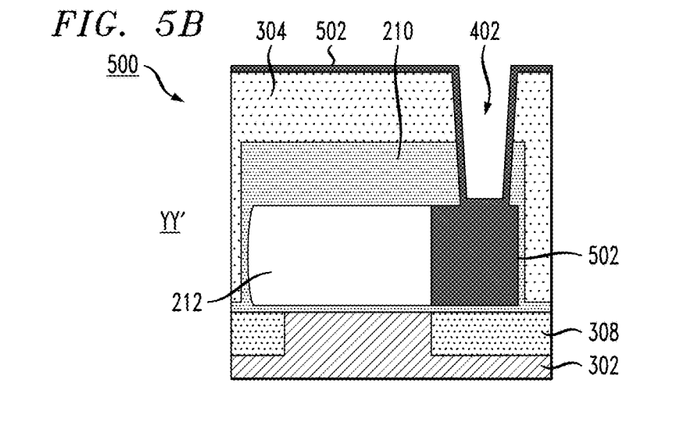
FIG. 5B illustrates a cross-sectional side view of the MOSFET of FIG. 2 along the YY' axis after SiN deposition, according to an embodiment of the invention.
Figure 5C:
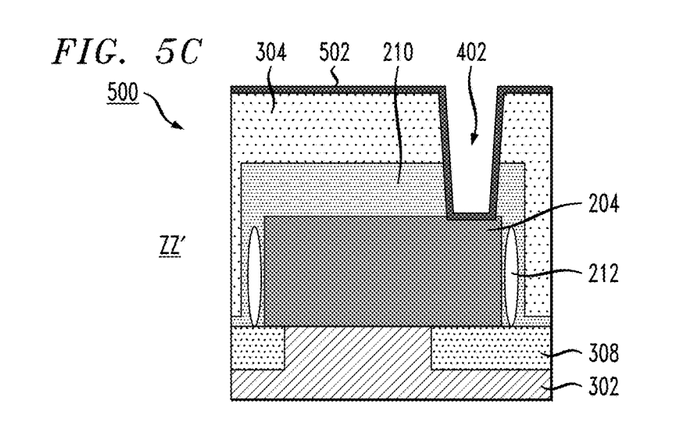
FIG. 5C illustrates a cross-sectional side view of the MOSFET of FIG. 2 along the ZZ' axis after SiN deposition, according to an embodiment of the invention.

In the next step of the process, a thin layer of SiN liner is deposited on the surface of the MOSFET device 200 as illustrated in FIGS. 5A through 5C. As shown in FIG. 5A, a thin layer of SiN liner 502 is deposited on top of the oxide layer 304. As shown in FIG. 5B, the SiN liner 502 also lines the sidewalls of gate contact trench 402 and the base of the gate contact trench 402. The SiN liner 502 further penetrates into the air-gap spacer 212, pinching off the gate contact trench 402 from the air-gap spacer 212. In FIG. 5B, the SiN liner 502 deposition fills a region of the air-gap spacer 212 immediately below the gate contact trench 402, reaching the base of the air-gap spacer 212. In other embodiments, the SiN liner 502 deposition may not reach the base of the air-gap spacer 212, but will penetrate into the air-gap spacer 212 deep enough to ensure pinching off the gate contact trench 402 from the air-gap spacer 212. It should be noted that the SiN liner 502 is chosen to be of a non-conformal material such that the pinch-off happens near the gate contact trench region in the air-gap spacer. FIG. 5C is a cross-sectional side view along the ZZ' axis illustrating the deposition of the SiN liner 502 over the oxide layer 304 and lining of the sidewalls and bottom of the gate contact trench 402. The cross-sectional view of FIG. 5C illustrates a region of the gate contact trench 402 over the gate 204.

Figure 6A:
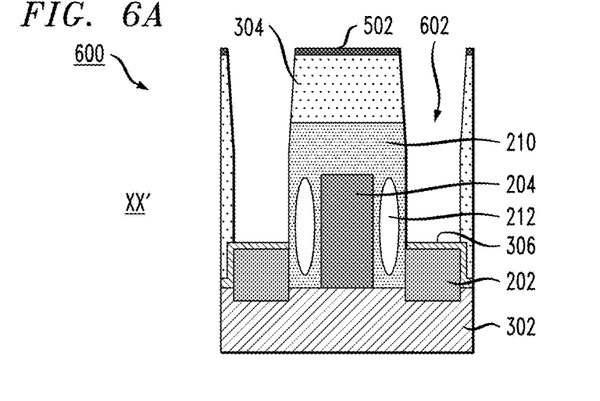
FIG. 6A illustrates a cross-sectional side view of the MOSFET of FIG. 2 along the XX' axis after source/drain contact RIE, according to an embodiment of the invention.
Figure 6B:
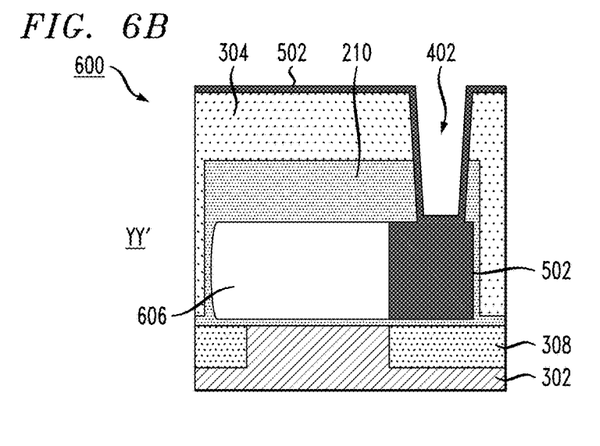
FIG. 6B illustrates a cross-sectional side view of the MOSFET of FIG. 2 along the YY' axis after source/drain contact RIE, according to an embodiment of the invention.
Figure 6C:
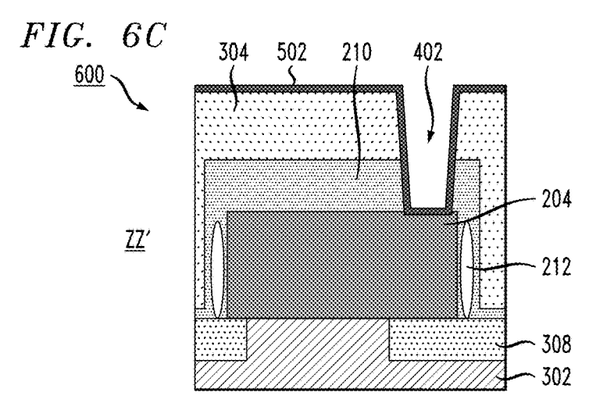
FIG. 6C illustrates a cross-sectional side view of the MOSFET of FIG. 2 along the ZZ' axis after source/drain contact RIE, according to an embodiment of the invention.

In the next step of the process, a second RIE is selectively tuned to open source/drain contact trenches. FIG. 6A shows a cross-sectional side view of the MOSFET device 200 along the XX' axis after a source/drain contact RIE. The etch process opens source/drain contact trenches 602 through the SiN liner 502 and oxide layer 304, down to the SiN POC layer 306 over the source/drain 202. The SiN POC layer 306 serves as an etch stop and remains intact after the source/drain contact RIE. The SiN liner 502 at the base of gate contact trench 402 remains in place as shown in FIGS. 6B and 6C.

Figure 7A:
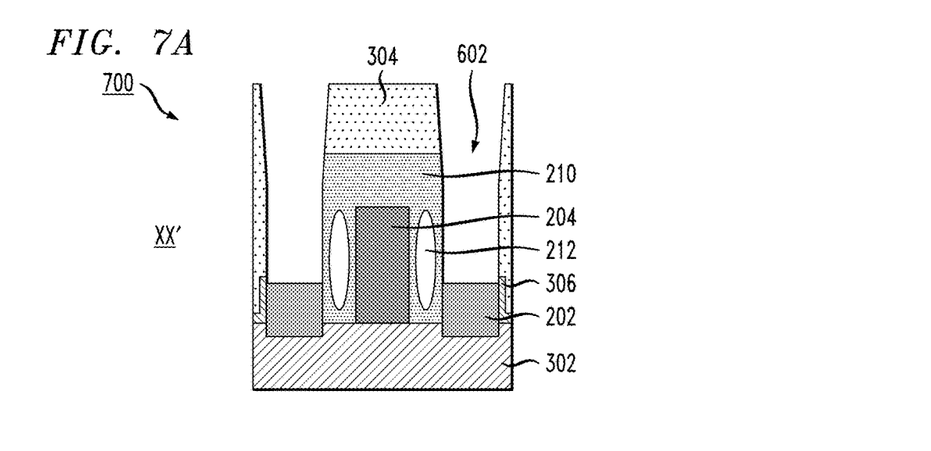
FIG. 7A illustrates a cross-sectional side view of the MOSFET of FIG. 2 along the XX' axis after SiN removal from source/drain and gate, according to an embodiment of the invention.
Figure 7B:
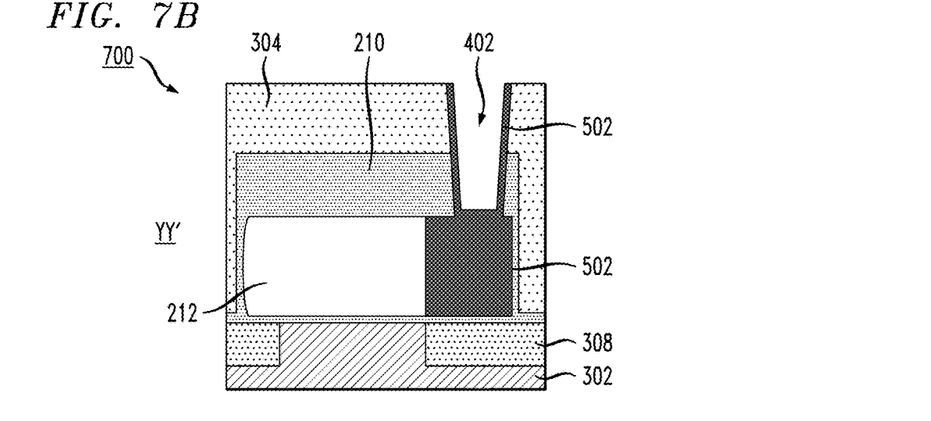
FIG. 7B illustrates a cross-sectional side view of the MOSFET of FIG. 2 along the YY' axis after SiN removal from source/drain and gate, according to an embodiment of the invention.
Figure 7C:
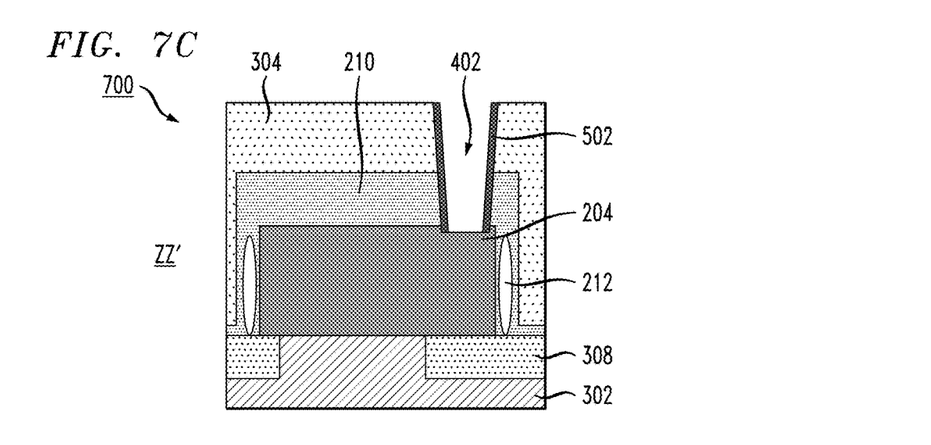
FIG. 7C illustrates a cross-sectional side view of the MOSFET of FIG. 2 along the ZZ' axis after SiN removal from source/drain and gate, according to an embodiment of the invention.

In the next step of the process, a third RIE is selectively tuned to remove the SiN POC layer 306 and the SiN liner 502 at the base of gate contact trench 402. FIG. 7A illustrates the MOSFET device 200 after the RIE removed the SiN POC layer 306 and the SiN liner 502. FIGS. 7B and 7C illustrate the MOSFET device 200 after removal of the SiN liner 502 at the base of gate contact trench 402. The SiN liner 502 on the sidewalls of gate contact trench 402 remains. It should be noted that the SiN liner deposition 502 in the air-gap spacer 212 that pinched off the air-gap near the base of the gate contact trench 402 also remains intact. This will prevent the subsequent gate contact metallization process from allowing the gate contact metal to enter the air-gap space.

Figure 8A:
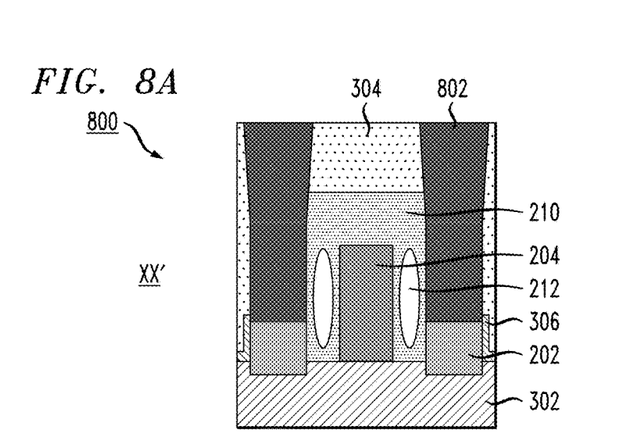
FIG. 8A illustrates a cross-sectional side view of the MOSFET of FIG. 2 along the XX' axis after source/drain and gate metallization, according to an embodiment of the invention.
Figure 8B:
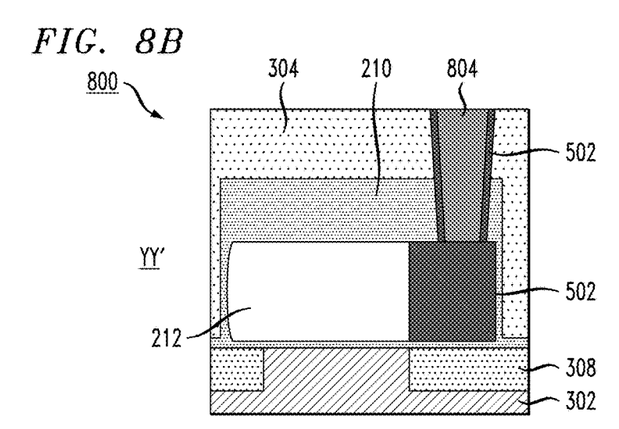
FIG. 8B illustrates a cross-sectional side view of the MOSFET of FIG. 1 along the YY' axis after source/drain and gate metallization, according to an embodiment of the invention.
Figure 8C:
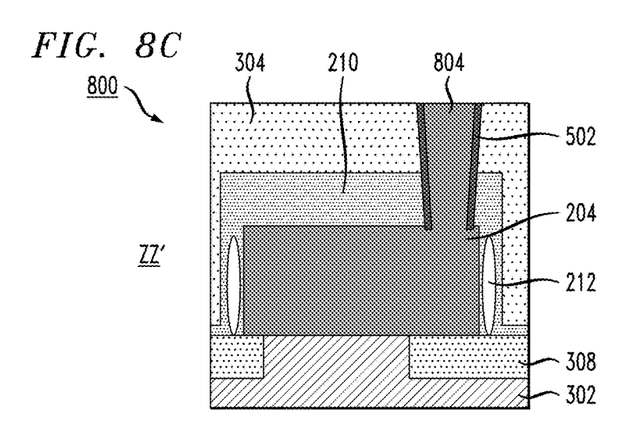
FIG. 8C illustrates a cross-sectional side view of the MOSFET of FIG. 1 along the ZZ' axis after source/drain and gate metallization, according to an embodiment of the invention.

Finally, source/drain contact metallization and gate contact metallization are completed. FIG. 8A illustrates the MOSFET device 200 having source/drain contact metallization 802. FIGS. 8B and 8C illustrate the MOSFET device 200 having gate contact metallization 804. Advantageously, none of the gate contact metallization 804 enters into the air-gap spacer 212 as illustrated in FIG. 8B.

It is to be understood that the term "liner" as used herein is intended to encompass a structure, layer, region, or the like, that pinches off the gate contact trench from the air-gap spacer. It is also to be appreciated that while illustrative embodiments describe liner deposition with respect to a gate contact trench, techniques described herein can be applied and/or adapted in a straightforward manner for source and/or drain contact trenches in the event that the subway condition would occur during formation of those contact trenches.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for forming a semiconductor device, comprising the steps of:
   forming a contact trench on a semiconductor structure over an air-gap spacer; and
   depositing a liner in the contact trench;
   wherein the liner fills a portion of the air-gap spacer pinching off the contact trench from the air-gap spacer; and
   wherein the liner deposition reaches the base of the air-gap spacer.

2. The method of claim 1, wherein the contact trench comprises sidewalls and the liner lines along the sidewalls of the contact trench.

3. The method of claim 1, wherein the contact trench is a gate contact trench forming over the air-gap spacer.

4. A method for forming a semiconductor device comprising the steps of:
   forming a silicon substrate;
   forming a source on the silicon substrate;
   forming a drain on the silicon substrate;
   forming a gate on the silicon substrate;
   depositing an inter layer dielectric on the silicon substrate; and
   depositing an oxide layer on the inter layer dielectric;
   wherein an air-gap spacer is located inside the inter layer dielectric; and further comprising:
   forming a contact trench over the air-gap spacer; and
   depositing a liner in the contact trench;
   wherein the liner fills a portion of the air-gap spacer pinching off the contact trench from the air-gap spacer.

5. The method of claim 4, wherein the source and the drain are separated from the oxide layer by a silicon-nitride poly-silicon open chemical mechanical polishing layer.

6. The method of claim 4, wherein the contact trench is a source or drain contact trench.

7. The method of claim 4, wherein forming the contact trench further comprises performing a reactive ion etching process.

8. The method of claim 4, wherein the inter layer dielectric comprises at least one of nitride and oxide.

9. The method of claim 1, wherein the liner comprises silicon-nitride.

10. The method of claim 1, wherein the material of the liner is a non-conformal material such that the pinch-off occurs in the air-gap spacer near the contact trench.

11. The method of claim 1, further comprising depositing contact metallization material in the contact trench wherein the liner in the air-gap spacer prevents the contact metallization material from leaking into the air-gap spacer.

12. A method for forming a semiconductor device, comprising the steps of:
   forming a gate contact trench on a gate structure of a field effect transistor device over an air-gap spacer; and
   depositing a liner in the gate contact trench;
   wherein the liner fills a portion of the air-gap spacer pinching off the gate contact trench from the air-gap spacer.

13. The method of claim 12, wherein the gate contact trench comprises sidewalls and the liner lines along the sidewalls of the gate contact trench.

14. The method of claim 12, wherein the material of the liner is a non-conformal material such that the pinch-off occurs in the air-gap spacer near the gate contact trench.

15. The method of claim 12, further comprising depositing gate contact metallization material in the gate contact trench wherein the liner in the air-gap spacer prevents the gate contact metallization material from leaking into the air-gap spacer.

* * * * *